United States Patent [19]
Miller

[11] Patent Number: 5,397,715
[45] Date of Patent: Mar. 14, 1995

[54] MOS TRANSISTOR HAVING INCREASED GATE-DRAIN CAPACITANCE

[75] Inventor: Bernard D. Miller, San Jose, Calif.
[73] Assignee: Micrel, Incorporated, San Jose, Calif.
[21] Appl. No.: 140,746
[22] Filed: Oct. 21, 1993
[51] Int. Cl.[6] .................... H01L 21/265; H01L 29/06
[52] U.S. Cl. ....................................... 437/27; 437/30; 437/41; 437/44; 257/346; 257/387
[58] Field of Search ............... 257/344, 346, 386, 387; 437/27, 29, 30, 34, 44, 41

[56] References Cited

U.S. PATENT DOCUMENTS

| | | | |
|---|---|---|---|
| H986 | 11/1991 | Codella et al. | 437/41 |
| 4,154,626 | 5/1979 | Joy et al. | 257/344 |
| 4,757,032 | 7/2988 | Contiero | 257/345 |
| 4,837,186 | 6/1989 | Ohata et al. | 437/228 |

FOREIGN PATENT DOCUMENTS

| | | | |
|---|---|---|---|
| 54-131888 | 10/1979 | Japan | 257/387 |
| 59-14903 | 4/1984 | Japan | 437/44 |

OTHER PUBLICATIONS

"Process for making very small asymmetric feed-effect transitions", *IBM Technical Disclosure Bulletin*, vol. 30, (Aug. 1987) pp. 1136–1137.

"High-performance FET deow structure and method", *IBM Technical Disclosure Bulletin*, vol. 15 (Sep. 1972) pp. 1342–1342a.

*Primary Examiner*—J. Carroll
*Attorney, Agent, or Firm*—Skjerven, Morrill, MacPherson, Franklin & Friel

[57] ABSTRACT

A process is described for providing a self-aligned MOS transistor having a selectable gate-drain capacitance. In a self-aligned process for forming a PMOS transistor, a polysilicon layer is etched to expose portions of an n-type substrate in which it is desired to form p+ drain regions. A deep p+ drain region is then formed in the surface of the substrate so as to have a large diffusion under the polysilicon layer. This large diffusion results in a high gate-drain capacitance. The polysilicon layer is further etched to form a gate. A self-aligned source is then formed using a separate, relatively shallow p+ diffusion. The selectable gate-drain capacitance obviates the need to form separate capacitors on the substrate to use as gate-drain capacitors.

6 Claims, 3 Drawing Sheets

MOS TRANSISTOR HAVING INCREASED GATE-DRAIN CAPACITANCE

BACKGROUND

FIG. 1 shows a typical prior art p-channel MOS transistor formed using a self-aligned process. In the exemplary device of FIG. 1, an n+ substrate 10 has an n$^{31}$ epitaxial layer 11 formed thereon. Highly doped p+ sources 12 and drain 13 are formed on either side of gates 14 in the surface of epitaxial layer 11. Aluminum source contacts 16 and drain contact 17 provide electrical contact to sources 12 and drain 13, respectively.

The shallow p+ diffused regions forming sources 12 and drain 13 are formed simultaneously using the same process steps. Generally, to form sources 12 and drain 13, gates 14 are first formed, and the surface of epitaxial layer 11 is exposed on both sides of gates 14. P-type dopants are then implanted using gates 14 as a mask so that the sources 12 and drain 13 become self-aligned with gates 14. A subsequent diffusion step causes the sources 12 and drain 13 to slightly diffuse under gates 14. Using a self-aligned method obviates the need for critical masking and alignment steps for aligning a gate with source and drain regions.

As illustrated in FIG. 1, gates 14 overlap p+ sources 12 by an underdiffusion length $U_s$. This overlap, separated by an oxide layer 15, creates a certain parasitic capacitance $C_{gs}$ between sources 12 and their associated gates 14. The magnitude of capacitance $C_{gs}$ depends upon the underdiffusion length $U_s$, where the longer the underdiffusion length $U_s$, the larger the capacitance $C_{gs}$. Similarly, gates 14 overlap the p+ drain 13 by an underdiffusion length $U_d$, resulting in a certain parasitic capacitance $C_{gd}$ between drain 13 and each of gates 14.

Since sources 12 and drain 13 are formed simultaneously during the same self-aligned process, the underdiffusion lengths $U_s$ and $U_d$ are equal.

Parasitic gate-drain capacitance $C_{gd}$ and parasitic gate-source capacitance $C_{gs}$ adversely affect the frequency response of MOS transistors. Moreover, excessive underdiffusion is a waste of valuable die area. Therefore, underdiffusion lengths $U_s$ and $U_d$ are normally minimized to maximize circuit speed and packing density.

Many circuits formed using MOS transistors call for a certain value capacitor to be inserted between a gate and a drain of a transistor. Typically, this capacitor is formed by a conductive plate of a selected area overlying and insulated from a diffused region or by connecting the sources and drains of a number of MOS transistors in parallel to make use of the parasitic capacitances of those MOS transistors. Therefore, when the need for a relatively high-value gate-drain capacitor arises, one or more capacitors must be formed on the semiconductor wafer surface. These extra capacitor(s) require additional die area. Further, if an upper plate of a capacitor is to be formed overlying a diffused bottom plate, this greatly complicates forming MOS transistors using a self-aligned gate/source/drain process where the gate is formed before the implantation of dopants.

For the foregoing reasons, there is a need for a method to form both a self-aligned MOS transistor and a gate-drain capacitor of a selected value without requiring significant additional die area and critical mask alignment steps to form the capacitor.

SUMMARY

The present invention is directed to a self-aligned process for manufacturing MOS transistors having a gate-drain underdiffusion $U_d$ that is a selected amount longer than the gate-source underdiffusion $U_s$, thus selectively increasing the gate-drain capacitance. This relatively large gate-drain capacitance obviates the need to form a separate capacitor to connect between the gate and drain of the transistor and does not require significant additional die area.

Assuming a PMOS transistor is to be formed, an additional masking and doping step is included in the PMOS fabrication sequence to introduce a deep, self-aligned p+ diffusion into the drain region before forming the self-aligned source and drain surface regions. The deep p+ drain diffusion is conducted to achieve the required diffusion under the gate so as to attain a desired value of gate-drain capacitance. The subsequent formation of the source region will preserve the desired small underdiffusion of the source impurities.

Because of the increased drain underdiffusion, the gate may need to be lengthened, depending on the length of the underdiffusion, to maintain the required channel length between the self-aligned source and drain to avoid voltage breakdown of the silicon at the intended operating voltages.

Using the above method, the gate-drain capacitance value of a self-aligned MOS transistor may be selected to be any of a wide range of values without substantially affecting the gate-source capacitance and without requiring significant additional area to form the capacitor. The need for a separate gate-drain capacitor has been eliminated.

BRIEF DESCRIPTION OF THE DRAWINGS

These and other features, aspects, and advantages of the present invention will become better understood with regard to the following description, appended claims, and accompanying drawings where:

DETAILED DESCRIPTION

FIGS. 2-6 illustrate an exemplary processing sequence for a PMOS transistor made in accordance with the present invention. An actual process may require well known additional steps, such as the formation of channel stops and isolation regions, as well as the formation of other components to be connected to the PMOS transistor. However, these additional structures form no part of this invention and are deleted for the sake of simplicity.

Figure 2:
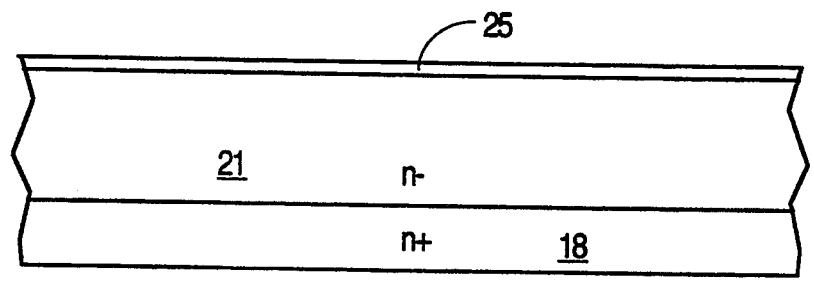
FIGS. 2-6 are cross-sections of a semiconductor wafer during the various process steps used for fabricating the preferred embodiment PMOS transistor of FIG. 6, having a selectable gate-drain capacitance, in accordance with the present invention.

In FIG. 2, a starting n+ substrate (i.e., wafer) 18 has grown on its surface an n− epitaxial layer 21. Epitaxial layer 21 may be eliminated if substrate 18 were of the appropriate resistivity.

A thin gate oxide layer 25, approximately 500 Angstroms (Å) thick, is then grown over the exposed surface of the wafer by exposing the wafer to an oxidizing environment.

Figure 3:
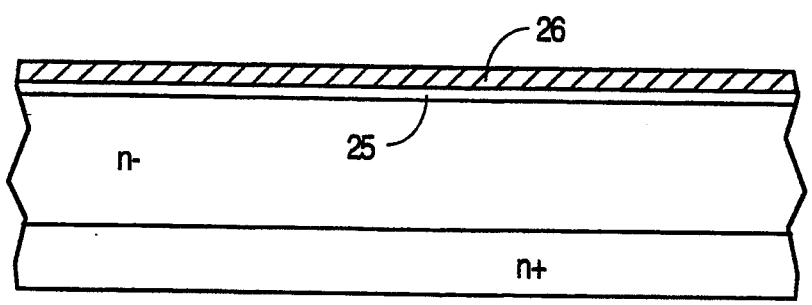

As shown in FIG. 3, a polysilicon (poly-Si) layer 26 is deposited over gate oxide layer 25 using a suitable CVD process.

Figure 4:
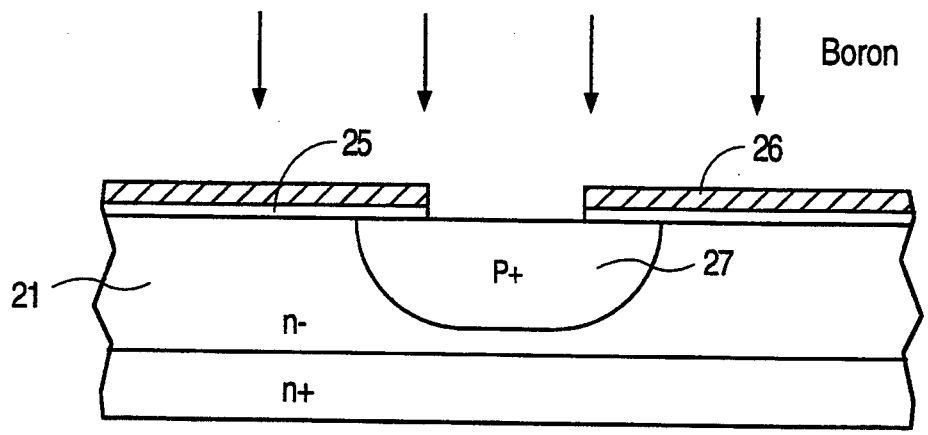

In FIG. 4, a first photolithographic masking and etching step selectively removes portions of the poly-Si layer 26 and underlying oxide layer 25, using well known methods, where it is desired to form the deep self-aligned drain region. P-type boron ions are then implanted into the exposed regions of epitaxial layer 21 at, in one embodiment, an energy of 50 KeV and a dosage of $5 \times 10^{13}$ ions/cm$^2$. The poly-Si layer 26 provides a barrier to the dopant ions and becomes heavily p-type during the implantation process.

The wafer is then subjected to a drive-in step to diffuse the boron ions under poly-Si layer 26 a desired amount to achieve the required gate-drain capacitance of the subsequently formed PMOS transistor. The approximate concentration of boron ions in drain region 27 after drive-in is $1 \times 10^{20}$ ions/cm$^3$. In one embodiment, drain region 27 is 3.5 microns deep and is diffused under gate 28 approximately 3 microns to achieve a desired gate-drain capacitance. The drive-in step also activates the boron ions in poly-Si layer 26 to make poly-Si layer 26 highly conductive.

Figure 5:
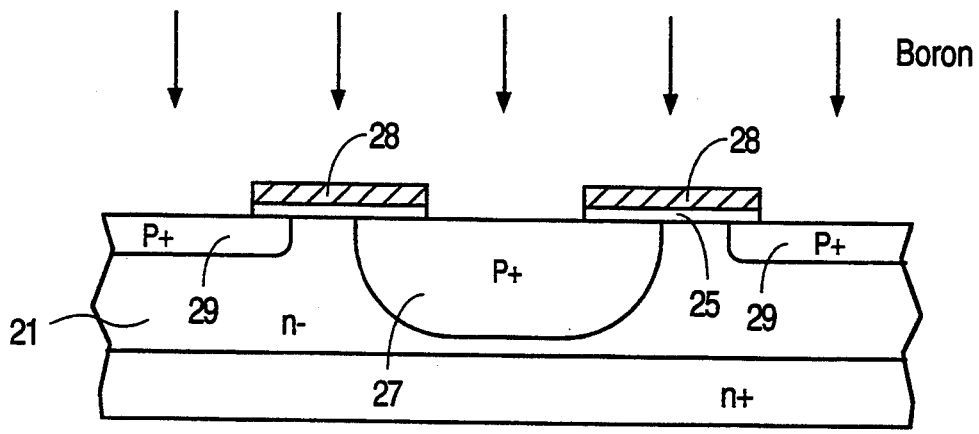

A next masking and etching step defines the gates of the PMOS transistor. As shown in FIG. 5, the portions of poly-Si layer 26 and oxide layer 25 above the intended source regions are removed to expose the underlying epitaxial layer 21. The remaining poly-Si layer portions form the gates 28 of the PMOS transistor. (Gates 28, although appearing in cross-section as comprising two elements, are electrically one element.)

The exposed surface of the wafer is again subjected to a blanket implant of p-type boron ions, using gates 28 as a mask to self-align the sources 29 and to additionally dope the surface of drain 27. These implanted ions may be driven-in to a shallow depth in any subsequent heating step used to form, for example, an oxide layer. After the drive-in step, the resulting p+ source 29 is defined by a p+ diffusion that is shallow relative to the first p+ drain 27 diffusion. The final concentration of boron ions in source 29 is, in one embodiment, approximately $3 \times 10^{19}$ ions/cm$^3$. (Similar to gates 28, sources 29 are electrically a single element.)

In one embodiment, the diffusion of sources 29 under gates 28 is approximately 0.5 microns.

Figure 6:
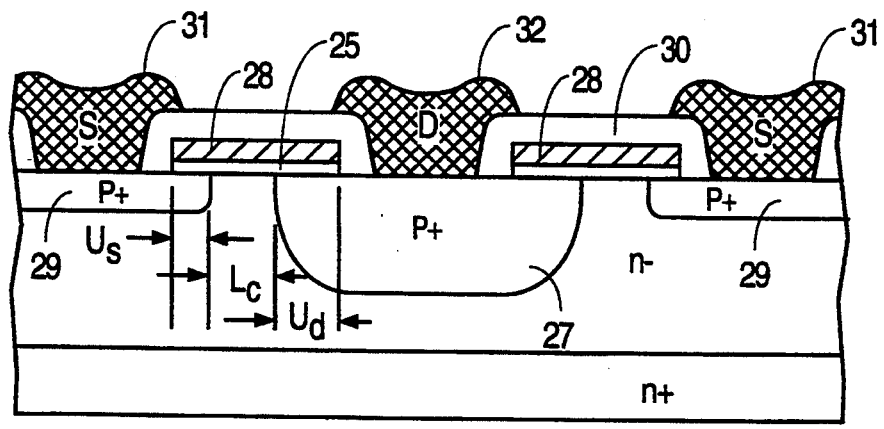

As shown in FIG. 6, a thick oxide layer 30 is deposited over the entire surface of the wafer. In one embodiment, oxide layer 30 is approximately 1.5 microns thick.

A next photolithographic masking and etching step exposes the areas where contact to the sources 29 and drain 27 of the PMOS transistor will be made. (Poly-Si gates 28 are exposed at a point not shown in the figures.) Aluminum is then deposited over the entire surface of the wafer.

A next photolithographic masking and etching step patterns the aluminum to form and define circuit contacts and connections. FIG. 6 shows the completed structure, including aluminum source contacts 31 and drain contact 32.

Figure 1:
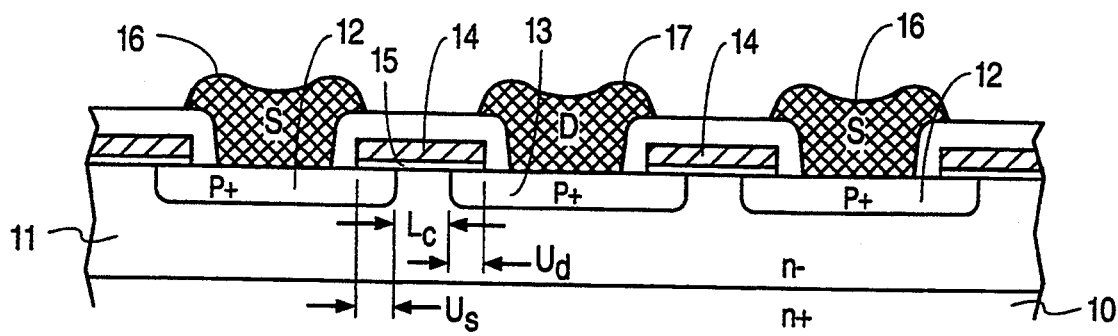
FIG. 1 is a cross-section of a prior art self-aligned PMOS transistor.

The shallow p+ source diffusion 29 provides a source underdiffusion (e.g., an overlap of gates 28 and the p+ sources 29) of length $U_s$ similar to that of the prior art, as shown in FIG. 1. The deep p+ drain 27 provides an increased length $U_d$ of drain underdiffusion, which provides an increased gate-drain capacitance $C_{gd}$. The length of gates 28 are chosen so that the resulting channel length $L_c$ between sources 29 and drain 27 will be sufficient to sustain the operating voltages of the transistor without a voltage breakdown of the silicon.

The steady-state gate-drain capacitance $C_{gd}$ of each PMOS transistor can be approximated using the following equation:

$$C_{gd} = \epsilon_s A_o / t_{ox} \tag{1}$$

where $\epsilon_s$ is the permittivity of SiO$_2$ ($34.5 \times 10^{-12}$F/m), $A_o$ is the area of overlap between gate 28 and drain 27, and $t_{ox}$ is the thickness of SiO$_2$ layer 25.

The area of overlap $A_o$ is approximately equal to the drain underdiffusion length $U_d$ multiplied by the total width $W_o$ of the overlap between gate 28 and drain 27. Thus, equation 1 may be expressed as:

$$C_{gd} = \epsilon_s U_d W_o / t_{ox} \tag{2}$$

Equation 2 may be used in combination with the above-described processing sequence to provide a self-aligned PMOS transistor having a desired gate-drain capacitance $C_{gd}$.

Deep p+ drain 27 may be formed, using the above techniques, to achieve virtually any drain underdiffusion length $U_d$, and consequently to achieve any desired gate-drain capacitance $C_{gd}$, without substantially affecting the gate-source capacitance $C_{gs}$.

Figure 7:
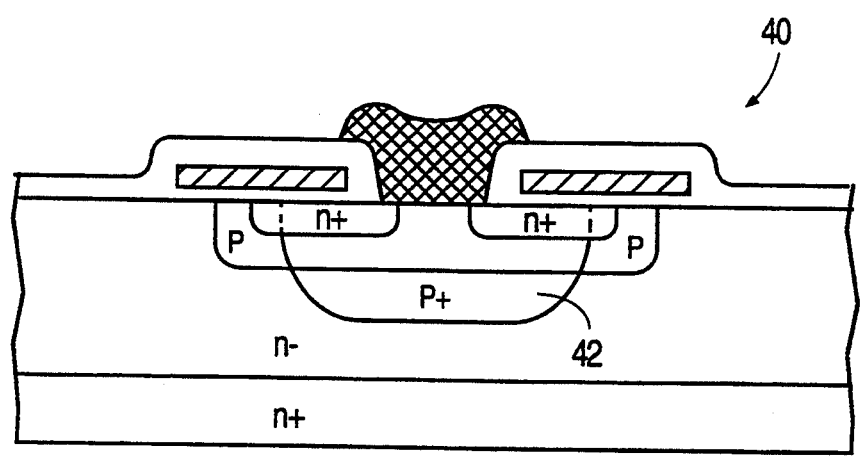
FIG. 7 is a cross-section of a vertical DMOS transistor formed in the same substrate as the transistor of FIG. 6.

As illustrated by the vertical DMOS transistor 40 cross-section of FIG. 7, the steps used to form p+ drain 27 in FIG. 6 can also be used to form the p+ body contact 42 of any vertical DMOS transistor 40 on the same wafer. Thus, no additional doping and diffusion steps would be incurred to form drain 27 when forming the lateral transistor of FIG. 6 along with vertical DMOS transistors.

Although the present invention has been described in detail with reference to certain preferred embodiments thereof, other embodiments incorporating the invention are possible. For example, an increased gate-source capacitance may be obtained by altering the process to allow for a deep p+ diffusion into the source region instead of the drain region. Additionally, the structure may be formed as an NMOS device. Therefore, the appended claims are not intended to limit the invention to the various embodiments specifically described herein.

What is claimed is:

1. A method for forming a self-aligned MOS transistor, said method comprising the steps of:

forming a layer of a gate-forming material overlying a surface of a semiconductor substrate of a first conductivity type;

removing a first portion of said layer to expose a first area of said surface;

depositing dopants of a second conductivity type in said first area to form a first region self-aligned with said gate-forming material, said first region being of said second conductivity type;

driving in said dopants in said first region to a selected first gate underdiffusion length to achieve a desired capacitance between said gate-forming material and said first region, wherein said first region serves as a drain region of said MOS transistor;

removing a second portion of said layer to expose a second area of said surface, a remaining portion of said layer forming a gate for said MOS transistor; and depositing dopants of said second conductivity type in said second area to form a second region self-aligned with said gate, said second region serving as a source region of said MOS transistor, wherein said second region has a second gate underdiffusion length which is substantially less than said first gate underdiffusion length.

2. The method of claim 1 wherein said surface comprises an epitaxial layer.

3. The method of claim 1 wherein dopants are deposited in both said first region and said second region during formation of said second region.

4. The method of claim 1 wherein said semiconductor substrate is silicon.

5. The method of claim 1 wherein said gate-forming material is polysilicon.

6. The method of claim 1 wherein said steps of depositing dopants to form said first region and driving in said dopants in said first region are also used to form a body contact region for a vertical DMOS transistor formed in said semiconductor substrate.

* * * * *

UNITED STATES PATENT AND TRADEMARK OFFICE
CERTIFICATE OF CORRECTION

PATENT NO. : 5,397,715
DATED : March 14, 1995
INVENTOR(S) : Bernard D. Miller

It is certified that error appears in the above-indentified patent and that said Letters Patent is hereby corrected as shown below:

Column 1, line 9, delete "$n^{31}$" and insert --$n^{-}$--.

Signed and Sealed this

Twenty-sixth Day of September, 1995

Attest:

BRUCE LEHMAN

*Attesting Officer*     *Commissioner of Patents and Trademarks*